United States Patent
Lee et al.

(10) Patent No.: US 12,417,031 B2
(45) Date of Patent: Sep. 16, 2025

(54) STORAGE SYSTEM INCLUDING BATTERY MODULE AND METHOD FOR OPERATING THE SAME

(71) Applicant: Samsung Electronics Co., Ltd., Suwon-si (KR)

(72) Inventors: Seunghan Lee, Suwon-si (KR); Sung Chul Hur, Suwon-si (KR); Brianmyungjune Jung, Suwon-si (KR); Sang-Hwa Jin, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 12 days.

(21) Appl. No.: 18/135,141

(22) Filed: Apr. 15, 2023

(65) Prior Publication Data
US 2023/0384944 A1 Nov. 30, 2023

(30) Foreign Application Priority Data

May 31, 2022 (KR) .................. 10-2022-0067031
Aug. 4, 2022 (KR) .................. 10-2022-0097524

(51) Int. Cl.
*G06F 3/06* (2006.01)
*G06F 1/30* (2006.01)

(52) U.S. Cl.
CPC .............. *G06F 3/0619* (2013.01); *G06F 1/30* (2013.01); *G06F 3/0652* (2013.01); *G06F 3/0673* (2013.01)

(58) Field of Classification Search
CPC ........ G06F 3/0619; G06F 1/30; G06F 3/0652; G06F 3/0673; G06F 11/1441; G06F 11/1446; G06F 11/2015; G06F 12/0868; G06F 3/0659; G06F 3/0688; G06F 2212/214; G06F 2212/261;
(Continued)

(56) References Cited

U.S. PATENT DOCUMENTS

| 7,085,886 B2 | 8/2006 | Hsu et al. |
| 7,269,755 B2 | 9/2007 | Moshayedi et al. |
| 7,613,877 B2 | 11/2009 | Shimozono et al. |

(Continued)

FOREIGN PATENT DOCUMENTS

| JP | 6014986 B2 | 10/2016 | |
| WO | WO-2015164794 A1 * | 10/2015 | ............ G05B 11/01 |
| WO | 2020186081 A1 | 9/2020 | |

OTHER PUBLICATIONS

Search Report dated Oct. 19, 2023 issued by the European Patent Office for corresponding EP Patent Application 23168170.1.

*Primary Examiner* — Hosain T Alam
*Assistant Examiner* — Zubair Ahmed
(74) *Attorney, Agent, or Firm* — Muir Patent Law, PLLC

(57) ABSTRACT

A storage system includes a host, a back plane including a switching block and connected to the host, a plurality of storage sets connected to the back plane to receive power from the host, and a battery module connected to the back plane to supply spare power to at least one storage set of the plurality of storage sets through the switching block, when an abnormal power drop is detected in the at least one storage set of the plurality of storage sets. The battery module controls the at least one storage set to perform a data flushing operation, when power less than or equal to a threshold value is detected in the at least one storage set after supplying the spare power.

18 Claims, 13 Drawing Sheets

(58) Field of Classification Search
CPC ......... G06F 2212/283; G06F 2212/313; G06F 1/189; G06F 1/263; G11C 5/141; G11C 16/30
USPC ................................................ 711/166, 154
See application file for complete search history.

(56) References Cited

U.S. PATENT DOCUMENTS

| | | |
|---|---|---|
| 9,037,879 B2 | 5/2015 | Jau et al. |
| 9,201,601 B2 | 12/2015 | Matsubara et al. |
| 9,710,343 B2 | 7/2017 | Petersen |
| 10,657,043 B2 | 5/2020 | Park et al. |
| 10,795,772 B2 | 10/2020 | Nakatsuka et al. |
| 2007/0094446 A1 | 4/2007 | Sone et al. |
| 2016/0041786 A1* | 2/2016 | Erez ...................... G06F 3/0625 711/103 |
| 2016/0118121 A1* | 4/2016 | Kelly ........................ G06F 1/30 710/301 |
| 2017/0091042 A1 | 3/2017 | Chou et al. |
| 2017/0255564 A1* | 9/2017 | Kitsunai ............. G06F 11/1458 |
| 2021/0034130 A1* | 2/2021 | Guim Bernat ........ G06F 1/3212 |

* cited by examiner

STORAGE SYSTEM INCLUDING BATTERY MODULE AND METHOD FOR OPERATING THE SAME

CROSS-REFERENCE TO RELATED APPLICATIONS

This application claims priority under 35 U.S.C. § 119 to Korean Patent Application Nos. 10-2022-0067031 filed on May 31, 2022 and 10-2022-0097524 filed on Aug. 4, 2022 in the Korean Intellectual Property Office, the disclosures of which are incorporated by reference herein in their entireties.

BACKGROUND

Embodiments of the present disclosure described herein relate to a storage system including a battery module and a method of operating the same.

A storage device is a device that stores data under the control of a host, such as a computer, a smartphone, or a smart pad, and includes a device that stores data in a semiconductor memory, especially a non-volatile memory, such as a solid state drive (SSD) or a memory card.

The storage device may perform a computing function, depending on implementing aspects, and may include an additional volatile memory and a core for the computing function such that the computing function may be performed. The storage device may operate by receiving power, and during the operation, a Sudden Power Off (SPO) situation may occur, where power is suddenly cut off. In this case, the storage device may perform a data flushing operation that dumps data, which is stored in the volatile memory, to the non-volatile memory. When the volatile memory has a larger size, an amount of data to be dumped may be increased. In this case, there is a limitation in supplying power for dumping by using only the capacity of the battery additionally provided in the storage device.

SUMMARY

Embodiments of the present disclosure provide a storage system including a battery module, capable of preventing data loss, when a power drop occurs in a storage device performing a computing function and a method of operating the same.

According to example embodiments, a storage system includes a host, a back plane including a switching block and connected to the host, a plurality of storage sets connected to the back plane to receive power from the host, and a battery module connected to the back plane to supply spare power to at least one storage set of the plurality of storage sets through the switching block, when an abnormal power drop is detected in the at least one storage set of the plurality of storage sets. The battery module controls the at least one storage set to perform a data flushing operation, when power less than or equal to a threshold value is detected in the at least one storage set after supplying the spare power.

According to example embodiments, a storage system may include a host, a back plane including a switching block, and connected to the host, a plurality of storage sets connected to the back plane to receive power from the host, and a battery module connected to the back plane to be offloaded a power management operation for the plurality of storage sets from the host, and performs the power management operation through the switching block.

According to example embodiments, an operating method of a storage system may include monitoring whether an abnormal power drop is detected in at least one storage set of a plurality of storage sets included in the storage system, supplying spare power to the at least one storage set when the power drop is detected, and controlling the at least one storage set to perform a data flushing operation, when power less than or equal to a threshold value is detected in the at least one storage set after supplying the spare power.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure will be described clearly and in detail such that those skilled in the art may easily reproduce the present disclosure.

Figure 1:
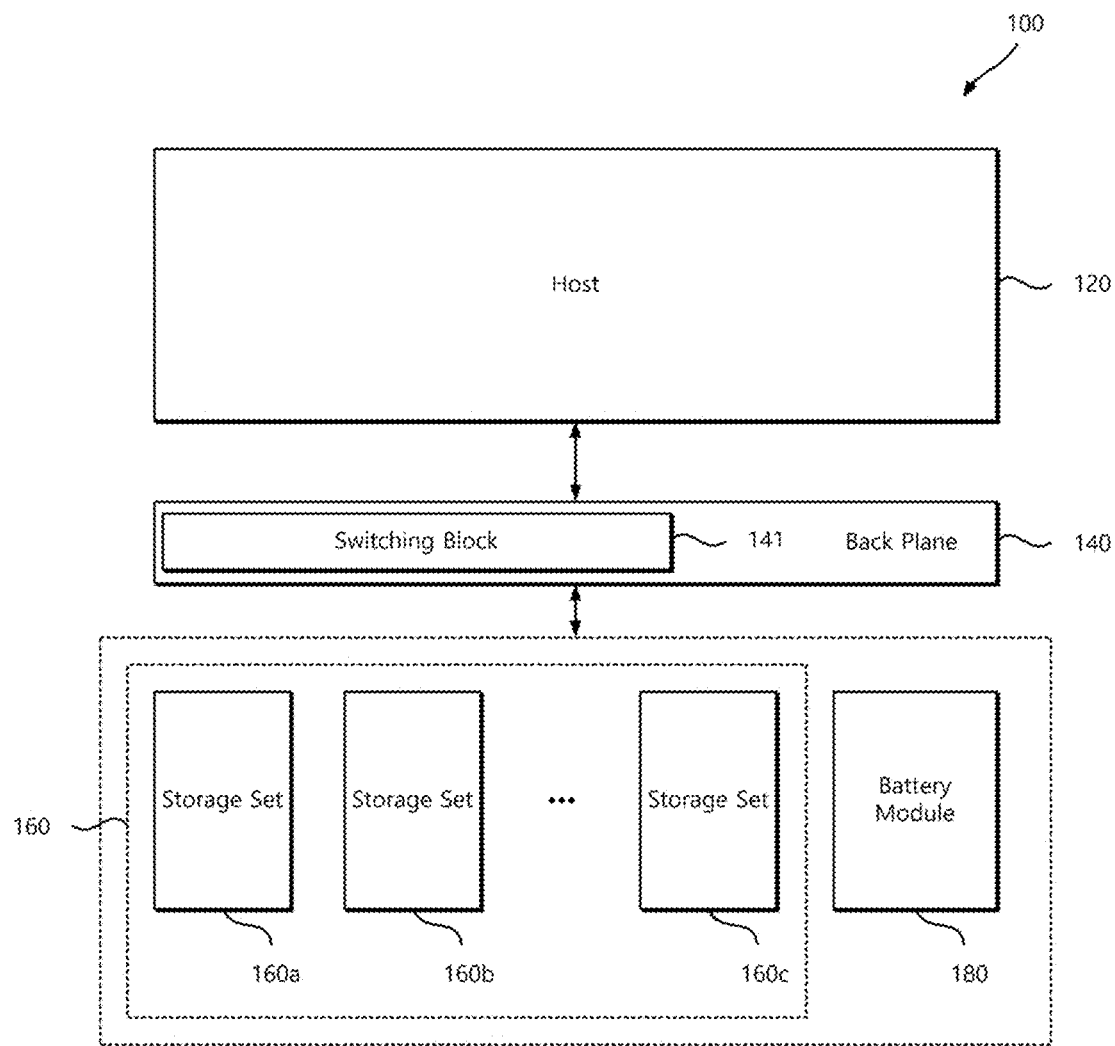
FIG. 1 illustrates a storage system according to an embodiment of the present disclosure.

FIG. 1 illustrates a storage system according to an embodiment of the present disclosure.

Referring to FIG. 1, a storage system 100 according to an embodiment of the present disclosure includes a host 120, a back plane 140, a storage set 160, and a battery module 180.

The storage system 100 may be implemented, for example, in the form of a server, a data center, a personal computer (PC), a network-coupled storage, an Internet of Things (IoT) device, or an electronic device. The electronic device may be one of a laptop computer, a mobile phone, a smartphone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, and a wearable device.

The host 120 may communicate with the storage set 160 through various interfaces. For example, the host 120 may be implemented in the form of an application processor (AP) or a system-on-a-chip (SoC). In addition, for example, the host 120 may be implemented in the form of an integrated circuit or a main board, but the present disclosure is not limited thereto.

The host 120 may transmit a write request and a read request to the storage set 160. The storage set 160 may store data received from a host, in response to the write request, or may read the stored data, in response to the read request and transmit the read data to the host 120.

In addition, the host 120 may control the use of the power of the storage set 160. For example, the host 120 may perform an operation of balancing the load of power or control a power management operation, such as an operation of supplying power to the storage set 160 through the back plane 140, monitoring power, or supplying, by the battery module 180, a spare power to the storage set 160 under a situation (for example, the SPO or power glitch) of abnormally supplying power. Alternatively, for example, the host 120 may offload the power management operation to the battery module 180, such that the battery module 180 performs the power management operation.

The back plane 140 may be provided between the host 120 and the storage set 160 and may be connected to the host 120 and the storage set 160. The back plane 140 may be configured to exchange data through various communication protocols.

The back plane 140 includes a switching block 141 configured to selectively supply power to at least one storage set of the storage set 160. The switching block 141 may be controlled by the host 120 or the battery module 180 and may provide power to the storage set 160 which needs to be supplied with power depending on a switching operation.

The storage set 160 and the battery module 180 may be received in a form factor. The form factor may include various form factors complying with a standard specification, and for example, may, but is not limited to, include an Enterprise and Data Center Standard Form Factor, such as E3.S, E3.S2T, E3.L, and E3.L2T.

The storage set 160 may include one storage set or a plurality of storage sets 160*a* to 160*c*, and may be connected to the host 120 and the battery module 180 through the back plane 140. Herein, for convenience of description, the terms of the storage set 160 and the plurality of storage sets 160 may be used interchangeably. Each of the plurality of storage sets 160*a* to 160*c* is a device having a computing function and a data storage function, and may also be referred to as a smart storage device (e.g., smartSSD). The storage set 160 may receive power from the host 120 and the battery module 180 through the back plane 140.

The battery module 180 is connected to the host 120 and the plurality of storage sets 160 through the back plane 140.

According to an embodiment, the battery module 180 may be configured to be offloaded a power management operation for the plurality of storage sets 160 from the host 120 and to perform the power management operation through the switching block 141. For example, at least a portion of the power management operation of the host 120 may be offloaded to the battery module 180. In this case, the battery module 180 may perform at least a portion of the power management operation, in place of the host 120.

According to an embodiment, the battery module 180 may be configured to detect an abnormal power drop in at least one storage set of the plurality of storage sets 160 and to supply the spare power through the switching block 141, when the power drop is detected. The abnormal power drop may refer to a situation, such as the SPO or the power glitch described above, in which power of the storage set 160 is rapidly lowered.

According to an embodiment, the battery module 180 may control at least one storage set to perform a data flushing operation, when power less than or equal to a threshold value is detected from the at least one storage set after supplying the spare power. According to the present disclosure, the data flushing operation may be defined as an operation of dumping data stored in the volatile memory into the non-volatile memory. For example, the battery module 180 may control the at least one storage set to dump data, which is stored in the volatile memory, to the non-volatile memory. For example, at least one storage set may include the volatile memory and the non-volatile memory.

According to embodiments as described above, the storage system 100 may further include the battery module 180 capable of offloading the power management operation of the host 120 to prevent the loss of data stored in the storage set 160 even in the situation, such as SPO or power glitch, in which the power is abnormally detected. According to the present disclosure, the increased power amount of the storage set 160 may be covered by adding a computing function to the storage set 160, instead of additionally including a power loss protection (PLP) block or a PLP battery to cope with the abnormal power detection.

Hereinafter, components included in the storage system 100 will be described.

Figure 2:
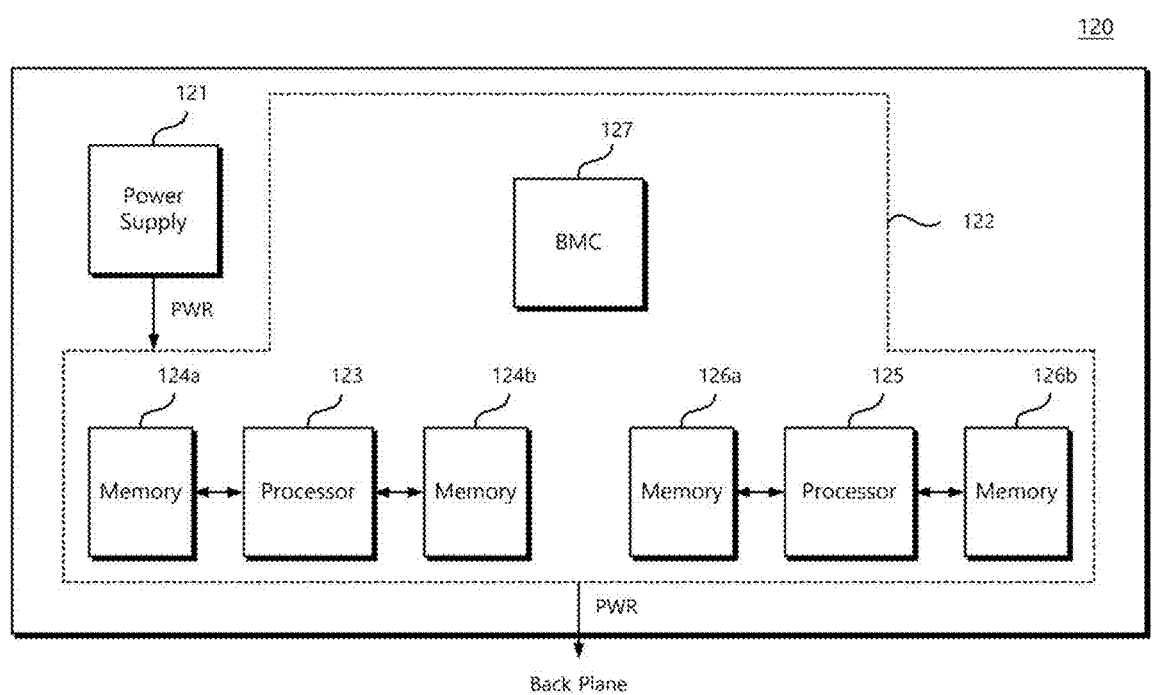
FIG. 2 illustrates a host according to an embodiment of the present disclosure.

FIG. 2 illustrates a host, according to an embodiment of the present disclosure.

Referring to FIG. 2, the host 120 according to an embodiment of the present disclosure includes a power supply 121 and a main board 122. The power supply 121 generates power PWR from a power source and supplies the generated power PWR to the main board 122. For example, the main board 122 may supply power PWR to the back plane 140. Alternatively, the power supply 121 may directly supply power PWR to the back plane 140.

The main board 122 may be referred to as a mother board or a base board, and includes a first processor 123, a plurality of first memories 124*a* and 124*b* connected to the first processor 123, a second processor 125, a plurality of second memories 126*a* and 126*b* connected to the second processor 125, and a baseboard management controller (BMC) 127.

The first processor 123 may use the plurality of first memories 124*a* and 124*b* as operating memories, and the second processor 125 may use the plurality of second memories 126*a* and 126*b* as operating memories. The first processor 123 and the second processor 125 may be configured to execute an operating system and various applications.

The first processor 123 and the second processor 125 may access the back plane 140 to control the use of the power for the plurality of storage sets 160. For example, the first processor 123 and the second processor 125 may perform an operation of balancing the load of power, or may control a power management operation, such as an operation of supplying power to the storage set 160 through the back plane 140, monitoring power, or supplying, by the battery module 180, the spare power to the storage set 160 under a situation (for example, the SPO or power glitch) of abnormally supplying power. Alternatively, for example, the first processor 123 and the second processor 125 may offload the power management operation to the battery module 180 such that the battery module 180 performs the power management operation.

For example, the first processor 123 and the second processor 125 may be a central processing unit CPU, and the plurality of first memories 124a and 124b and the plurality of second memories 126a and 126b may be volatile memories, such as dynamic random access memory (DRAM) or static RAM (SRAM).

The BMC 127 may be a system separate from the first processor 123 and the second processor 125, and may monitor the physical state, such as a temperature, humidity, a voltage of the power supply 121, a fan speed, a communication parameter, or an operating system function, of components of the storage system 100. Alternatively, for example, the BMC 127 may offload the power management operation to the battery module 180.

Figure 3:
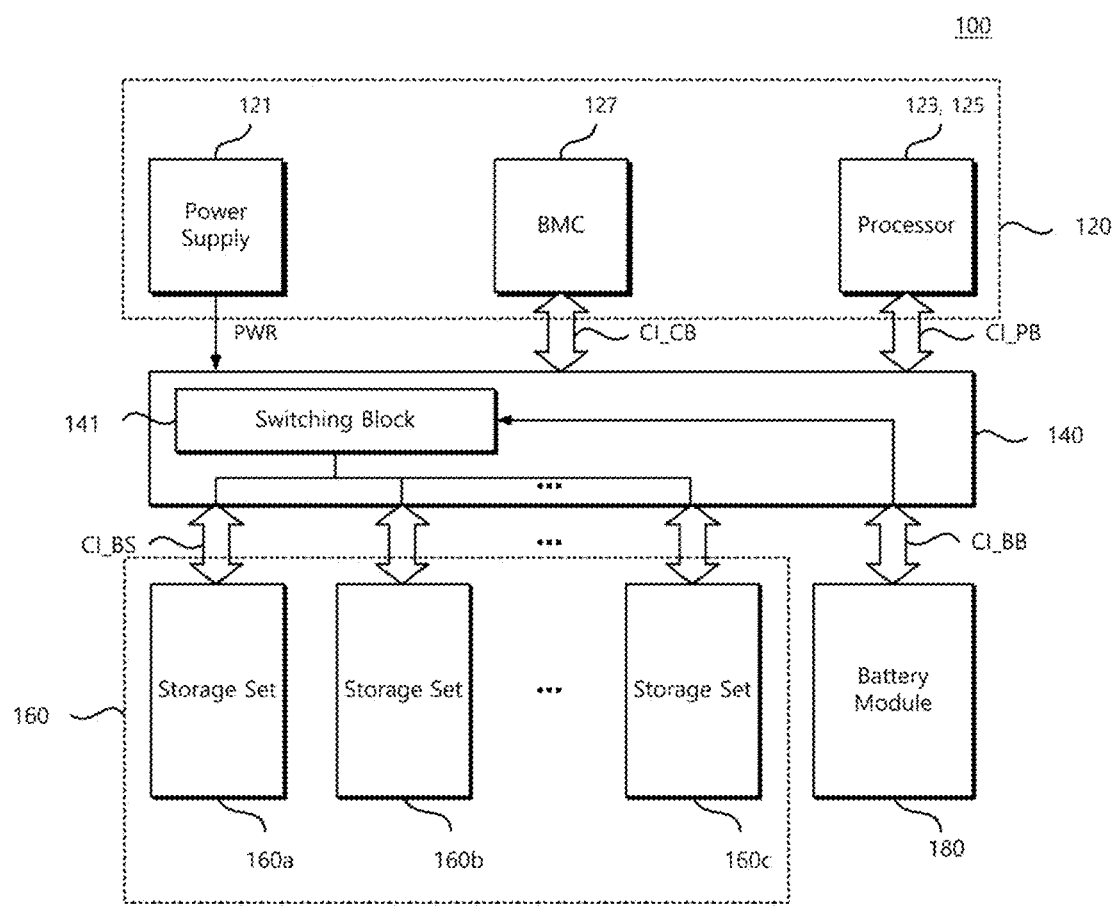
FIGS. 3 and 4 are views illustrating an operation for supplying power of a battery module according to various embodiments of the present disclosure.
Figure 4:
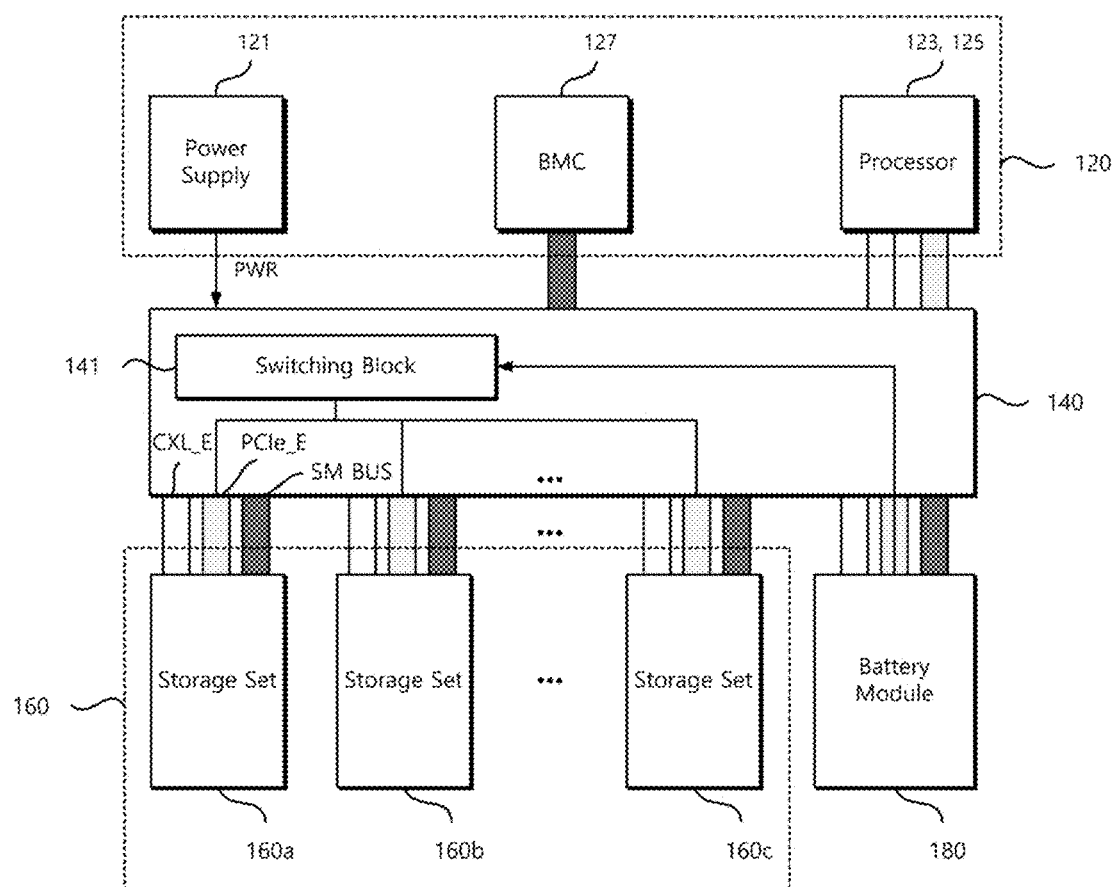

FIGS. 3 and 4 are views illustrating an operation for supplying power of a battery module according to various embodiments of the present disclosure.

Referring to FIG. 3, the back plane 140 may receive power directly or indirectly from the power supply 121 included in the host 120 and may transmit the power, which is supplied, to the plurality of storage sets 160 through the switching block 141 of the back plane 140.

The back plane 140 is connected to the host 120 (e.g., BMC 127, the first processor 123, and the second processor 125), each storage set of the plurality of storage sets 160, and the battery module 180 through connection interfaces CI_CB, CI_PB, CI_BS, and CI_BB, respectively. The connection interface may be an interface protocol, for example, a Peripheral Component Interconnect-Express (PCI-E), Advanced Technology Attachment (ATA), Serial ATA (SATA), Parallel ATA (PATA), serial attached SCSI (SAS) or Computer eXpress Link (CXL), or another interface protocol such as a System Management (SM) bus, a Universal Serial Bus (USB), a Multi-Media Card (MMC), an Enhanced Small Disk Interface (ESDI), or an Integrated Drive Electronics (IDE).

The switching block 141 may be connected to each of the plurality of storage sets 160 through the above-described various connection interfaces CI_BS, and the battery module 180 may control the switching block 141 through the connection interface CI_BB to supply power to at least one storage set.

Referring to FIG. 4, the connection interface according to an embodiment may include a CXL interface (CXL_E), a PCIe interface (PCIe_E), and an SM bus (SM_BUS). In this case, the BMC 127 of the host 120 is connected to the back plane 140 through the SM bus (SM_BUS), and at least one of the first processor 123 and the second processor 125 is connected to the back plane 140 through the CXL interface (CXL_E) and the PCIe interface (PCIe_E). The plurality of storage sets 160 are connected to the back plane 140 through the CXL interface (CXL_E), the PCIe interface (PCIe_E), and the SM bus (SM_BUS). Alternatively, according to an embodiment, the CXL interface (CXL_E) may not be provided. In this case, the host 120 may also be able to access data using CXL protocols (e.g., CXL.io, CXL.cache, and CXL.memory) through the PCIe interface (PCIe_E).

The switching block 141 is connected to each of the plurality of storage sets 160 through the PCIe interface (PCIe_E), and is switched under the control of the battery module 180 to supply power to at least one storage set.

Figure 5:
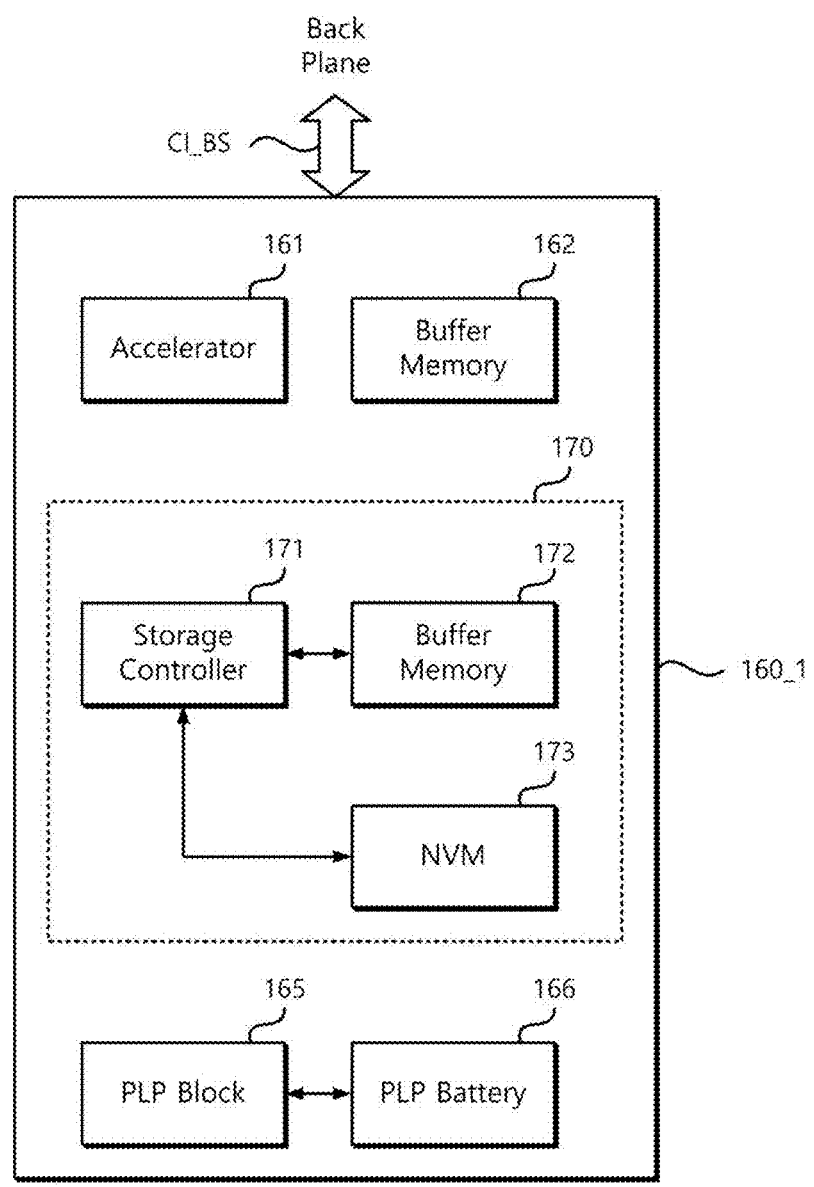
FIGS. 5 and 6 are views illustrating a storage set according to various embodiments of the present disclosure.
Figure 6:
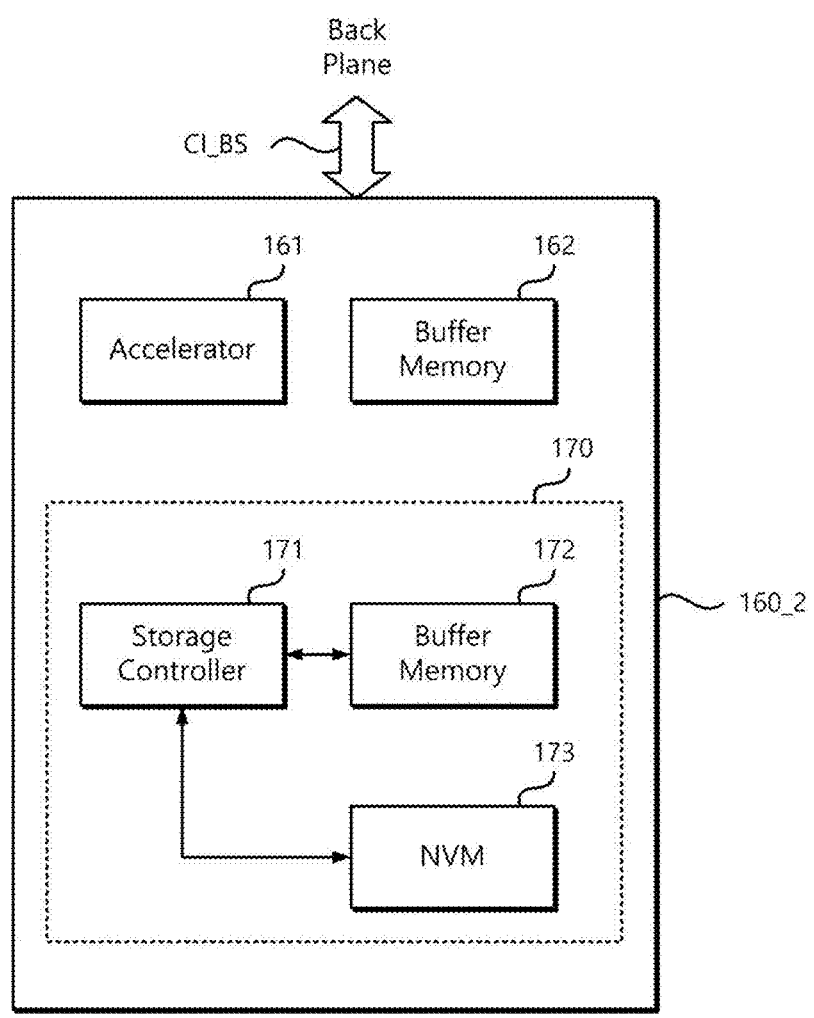

FIGS. 5 and 6 illustrate a storage set according to various embodiments of the present disclosure.

Referring to FIG. 5, a storage set 160_1 according to an embodiment is connected to the back plane 140 through a connection interface CI_BS and includes an accelerator 161, a buffer memory 162, a storage device 170, a power loss protection (PLP) block 165, and a PLP battery 166. Herein, the storage set 160_1 may be one of the plurality of storage sets 160a to 160c.

The accelerator 161 may perform an acceleration function to assist the computation of the host 120 by performing some of the operations performed by the host 120. For example, the accelerator 161 may be connected to the storage device 170 to receive input data from the storage device 170, to perform a computation for the input data such that computation data is generated, and to store the generated computation data in a buffer memory or transmit the computation data to the storage device 170. The accelerator 161 may perform the above-described computing operation, in response to a command of the host 120.

The buffer memory 162 may store the computation data based on the computation from the accelerator 161. Alternatively, according to an embodiment, the buffer memory 162 may store system data offloaded from the host 120. The buffer memory 162 may be a volatile memory such as DRAM or SRAM.

The storage device 170 may be an internal memory embedded in the electronic device. For example, the storage device 170 may be a solid state drive (SSD), an embedded universal flash storage (UFS) memory device, or an embedded multi-media card (eMMC). According to some embodiments, the storage device 170 may be an external memory detachable to or from the electronic device. For example, the storage device 170 may be a UFS memory card, Compact Flash (CF), Secure Digital (SD), Micro-SD (MicroSecure Digital), Mini Secure Digital (Mini-SD), extreme digital (xD) or a Memory Stick.

The storage device 170 may communicate with the host 120 through the connection interface CI_BS described above. The story device 170 may receive a command (host command) from the host 120 and analyze the command to generate a command for controlling the accelerator 161.

The storage device 170 includes a storage controller 171, a buffer memory 172, and a non-volatile memory (NVM) 173. For example, the storage controller 171, the buffer memory 172, and the NVM 173 may be implemented in the form of individual chips, respectively. The storage controller 171 may generate input data necessary for the host 120 to perform the requested operation, based on a command, or may read the input data out of the buffer memory 172 or the NVM 173.

The PLP block 165 is included in the storage device 170 to prevent power loss in an abnormal power drop situation. The PLP block 165 is connected to the PLP battery 166 and may perform an operation of supplying power to the storage device 170 to prevent data loss, when a power drop is detected while monitoring the power of the storage device 170. However, since the PLP battery 166 uses a capacitor, it may be difficult to supply a sufficient amount of power to the storage device 170.

Referring to FIG. 6, although a storage set 160_2 according to another embodiment is connected to the back plane 140 through the connection interface CI_BS, and includes the accelerator 161, the buffer memory 162, and the storage device 170, the PLP block 165 and the PLP battery 166 may be omitted. Herein, the storage set 160_2 may be one of the plurality of storage sets 160a to 160c. When the PLP block 165 and the PLP battery 166 are omitted, the battery module 180 performs a function of the PLP block 165. For example, when the abnormal power drop is detected in the storage device 170, the storage device 170 may receive power from the battery module 180 and may perform the data flushing operation that dumps data stored in the buffer memory 162 or 172 to the NVM 173 under the control of the battery module 180.

Figure 7:
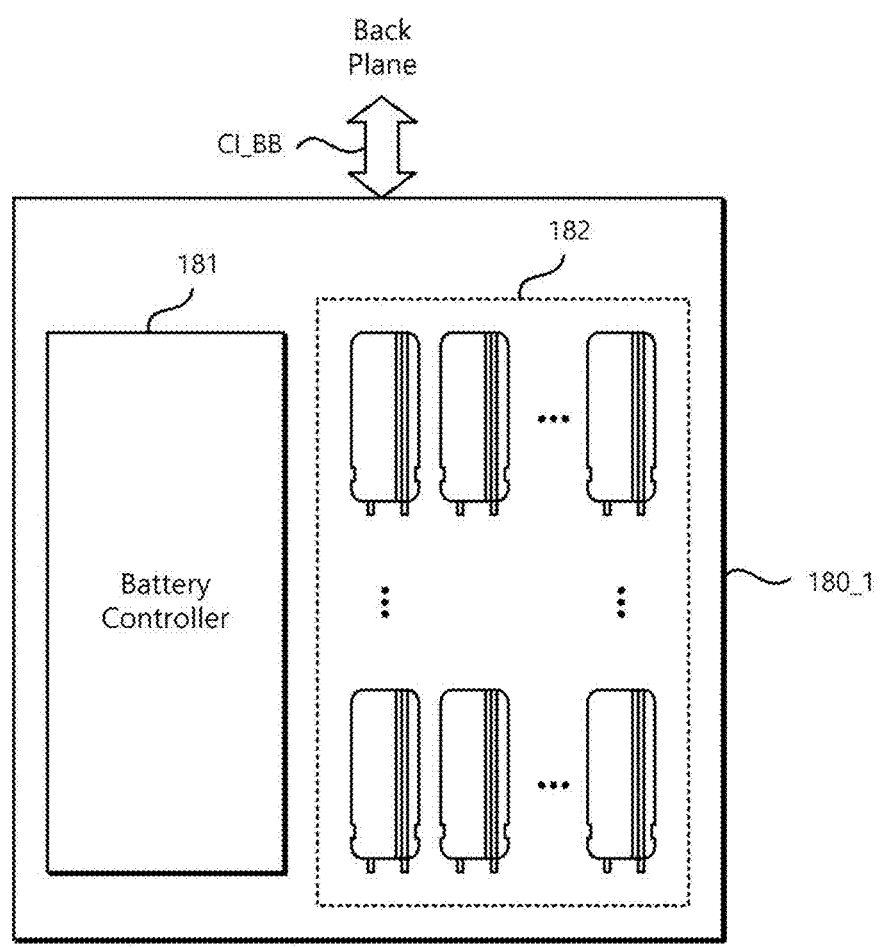
FIG. 7 is a view illustrating a battery module according to an embodiment of the present disclosure.

FIG. 7 illustrates a battery module according to one embodiment of the present disclosure.

Referring to FIG. 7, a battery module 180_1 includes a battery controller 181 and at least one battery 182. Herein, the battery module 180_1 of FIG. 7 may be replaced with the battery module 180 of FIGS. 1, 3, and 4.

The battery controller 181 is connected to the back plane 140 through the connection interface CI_BB, offloaded the power management operation for the plurality of storage sets 160 from the host 120, and performs the offloaded power management operation through the switching block 141. The battery controller 181 may be a logic chip which may be reconfigured and reprogrammed for offloading. For example, the battery controller 181 may be a field programmable gate array (FPGA), a microcontroller unit (MCU), a programmable logic device (PLD), or a complex PLD (CPLD).

At least one battery 182 is electrically connected to the battery controller 181, to supply power stored therein to the storage set 160 under the control of the battery controller 181. The at least one battery 182 may be configured to store energy greater than that of the PLP battery 166 in the storage device 170.

Hereinafter, various embodiments related to the battery controller 181 of FIG. 7 will be described.

Power Management Operation

According to an embodiment, the battery controller 181 may be offloaded the power management operation of at least one of the BMC 127, the first processor 123 and the second processor 125 included in the host 120 through the connection interface CI_BB. Alternatively, the battery controller 181 may be offloaded not only the power management operation but also information, such as a power policy or a priority set for each of the plurality of storage sets 160, for each of the plurality of storage sets 160 through the connection interface (CI_BB). The priority may be set be higher for the storage set 160 which needs to be supplied with power first, when an abnormal situation (e.g., SPO or power glitch) occurs. In this case, the storage set 160 having a high need for receiving power may be, for example, the storage set 160 which performs a computation having a higher need for protection or stores computation data resulting from the computation.

For example, the battery controller 181 may be offloaded power management operations based on the TP 4091 standard implemented such that NVM express (NVMe) supports offloading the function of the host 120 to the storage device 170.

Figure 8:
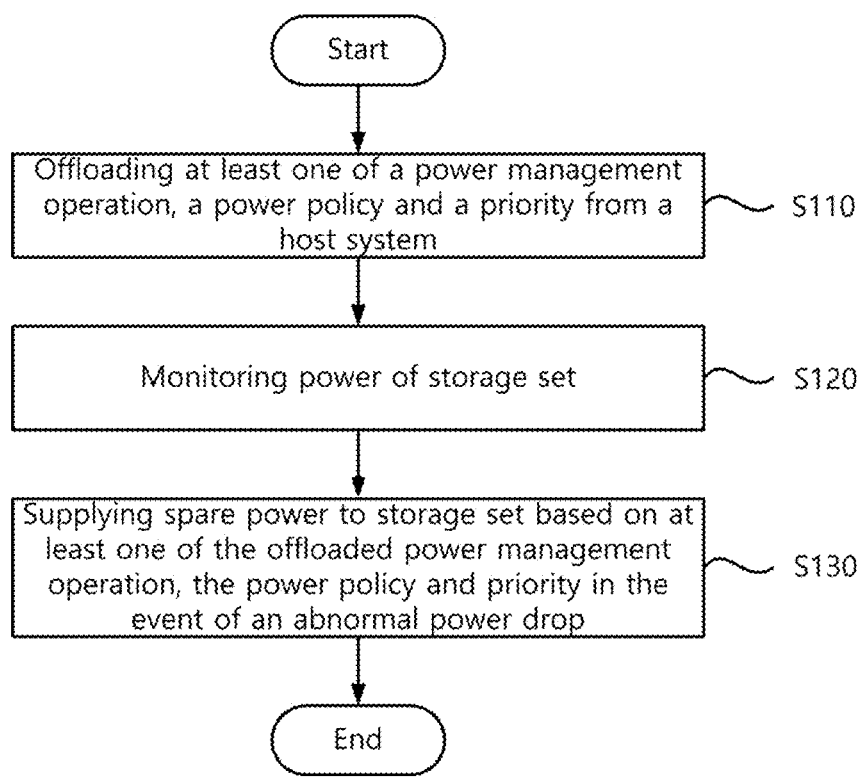
FIG. 8 is a flowchart illustrating a method of operating a battery controller according to an embodiment of the present disclosure.

FIG. 8 is a flowchart illustrating an operating method of a battery controller, according to an embodiment of the present disclosure.

Referring to FIG. 8, in step S110, the battery controller 181 may be offloaded at least one of the power management operation for the plurality of storage sets 160, the power policy set for each of the plurality of storage sets 160, and the priority set for each of the plurality of storage sets 160. For example, by programming, the battery controller 181 may be offloaded at least one of the power management operation for the plurality of storage sets 160, the power policy set and the priority set for each of the plurality of storage sets 160. For example, the host 120 may offload at least one of the power management operation for the plurality of storage sets 160, the power policy and the priority for each of the plurality of storage sets 160, to the battery controller 181.

In step S120, the battery controller 181 monitors the power of the storage set 160 through the connection interface. The monitoring of the power is an operation for sensing the abnormal power drop described above. For example, the monitoring of the power for the storage set 160 may be performed through an SM bus (SM_BUS).

In step S130, the battery controller 181 supplies spare power to the storage set 160, based on at least one of the power management operation, the power policy, or the priority, which is offloaded, when the abnormal power drop occurs. For example, the battery controller 181 may first provide spare power to the storage set 160 having the highest priority or at least one storage set having the higher priority, based on the priorities set for the plurality of storage sets 160.

According to an embodiment, the battery controller 181 may perform an operation of balancing the load of power. The battery controller 181 monitors power of the storage set 160 through the connection interface CI_BB. The battery controller 181 detects a work load for each of the plurality of storage sets 160 through monitoring. For example, the work load may refer to a load for each storage set 160 depending on an input/output operation or a computation operation between the host 120 and the storage set 160.

The battery controller 181 sets a threshold value for each of the plurality of storage sets 160 based on the work load. In this case, the threshold value refers to a power threshold for performing the above-described data flushing. For example, the battery controller 181 may set a higher threshold for one storage set 160, when it is determined that an amount of computation performed or to be performed in the one storage set 160 is greater than an amount of computation performed or to be performed in another storage set 160. For example, the battery controller 181 may set a higher threshold for any one storage set 160 of the plurality of storage sets 160, when it is determined that an amount of data to be written to or read out of the one storage set 160 of the plurality of storage sets 160 is greater than an amount of data written to or read out of another storage set 160 of the plurality of storage sets 160.

In addition, the battery controller 181 sets an amount of spare power to be supplied for each of the plurality of storage sets 160, based on the work load, when the power drop occurs. For example, the storage set 160 having a larger amount of work load may be set to have a larger amount of spare power.

Figure 9:
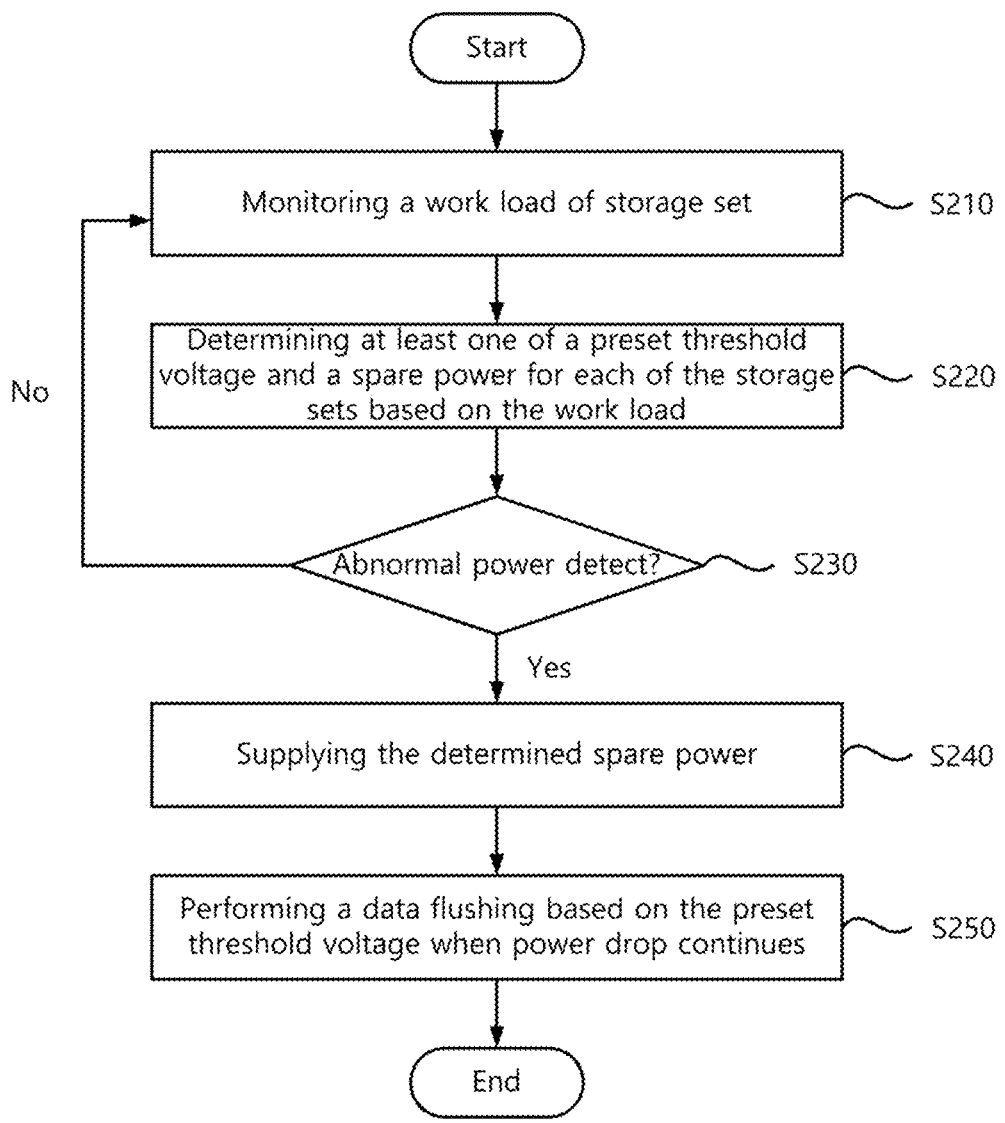
FIG. 9 is a flowchart illustrating a method of operating a battery controller according to another embodiment of the present disclosure.

FIG. 9 is a flowchart illustrating an operation of a battery controller, according to another embodiment of the present disclosure.

Referring to FIG. 9, in step S210, the battery controller 181 monitors and detects a work load for the plurality of storage sets 160.

In step S220, the battery controller 181 determines at least one of a threshold value or a spare power for each of the plurality of storage sets 160, based on the detected work load. For example, the battery controller 181 may set the threshold value or the spare power to be higher, as the work load is increased as described above.

In step S230, the battery controller 181 determines whether the abnormal power drop is detected in at least one storage set of the plurality of storage sets 160 through the monitoring. When the abnormal power drop is not detected in S230 (e.g., No), the battery controller 181 may perform step S210.

When it is determined that the power drop is detected in step S230, the battery controller 181 starts supplying power based on the spare power determined by using at least one battery 182 in step S240.

When the power drop consecutively occurs even if the spare power is supplied, the battery controller 181 may perform the data flushing operation based on the threshold value in step S250.

According to embodiments of the present disclosure as described above, the battery controller 181 may be offloaded the power management operation from the host 120 and perform at least portion of the power management operation or a power supplying operation of the plurality of storage sets 160, in place of the host 120, thereby improving the efficiency of the storage system 100. In addition, the battery controller 181 may set the threshold value or the spare power necessary for the power management operation by individually considering the work load for each of the plurality of storage sets 160.

Power Drop Protection

According to an embodiment, the battery controller 181 monitors the plurality of storage sets 160 and may detect abnormal power drops from the plurality of storage sets 160 through monitoring. For example, the battery controller 181 may monitor the storage set 160 through the SM bus SM_BUS included in the connection interface.

When a power drop is detected, the battery controller 181 controls the switching block to supply the spare power, which is received from at least one battery 182, to at least one storage set where the power drop is detected. The battery controller 181 controls at least one storage set to perform a data flushing operation, when power less than or equal to the threshold value is detected in at least one storage set after supplying the spare power.

Figure 10A:
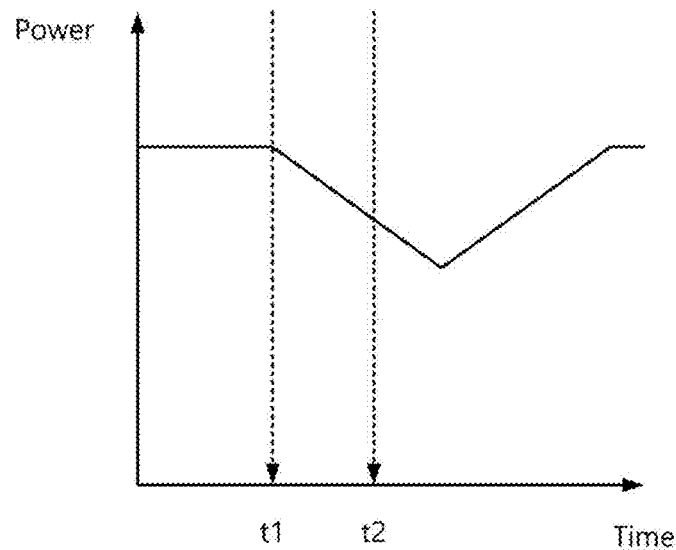
FIGS. 10A and 10B are views illustrating an operating of managing power of a battery controller according to example embodiments.
Figure 10B:
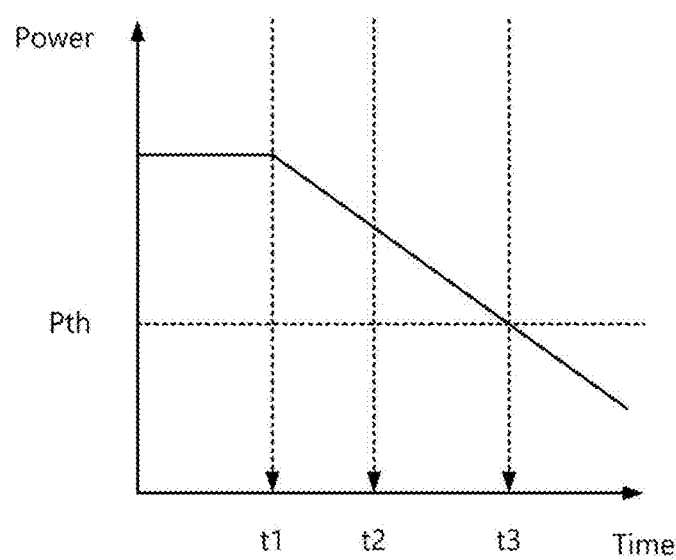

FIGS. 10A and 10B are graphs illustrating a power management operation of a battery controller according to example embodiments.

Referring to FIG. 10A, before a power drop from the plurality of storage sets 160 is detected, that is, when the power drop is not detected, the plurality of storage sets 160 performs an operation of supplying power from the host 120. When an abnormal power drop is detected from the storage set 160 at a time point of t1, the spare power is started to be supplied. For example, the spare power may be supplied immediately at the time point of t1 when the power drop is detected, or may be supplied at a time point of t2 after a preset time from the time point of t1 when the power drop is detected. When the power less than or equal to the threshold value is not detected in at least one storage set after supplying the spare power, the battery controller 181 may continue to monitor power drop again.

Referring to FIG. 10B, when the power drop is detected at the time point of t1, the battery controller 181 similarly starts supplying the spare power at the time point of t2. When power less than or equal to the threshold value is detected due to the consecutive power drop even though the spare power is supplied at a time point of t3, the battery controller 181 controls the storage set 160 to perform the data flushing operation. For example, the battery controller 181 controls the storage set 160 to perform the data flushing operation at the time point of t3 when the power (e.g., Pth) less than or equal to the threshold value is detected, and the storage set 160 dumps data, which is stored in the buffer memory, to the NVM.

Figure 11:
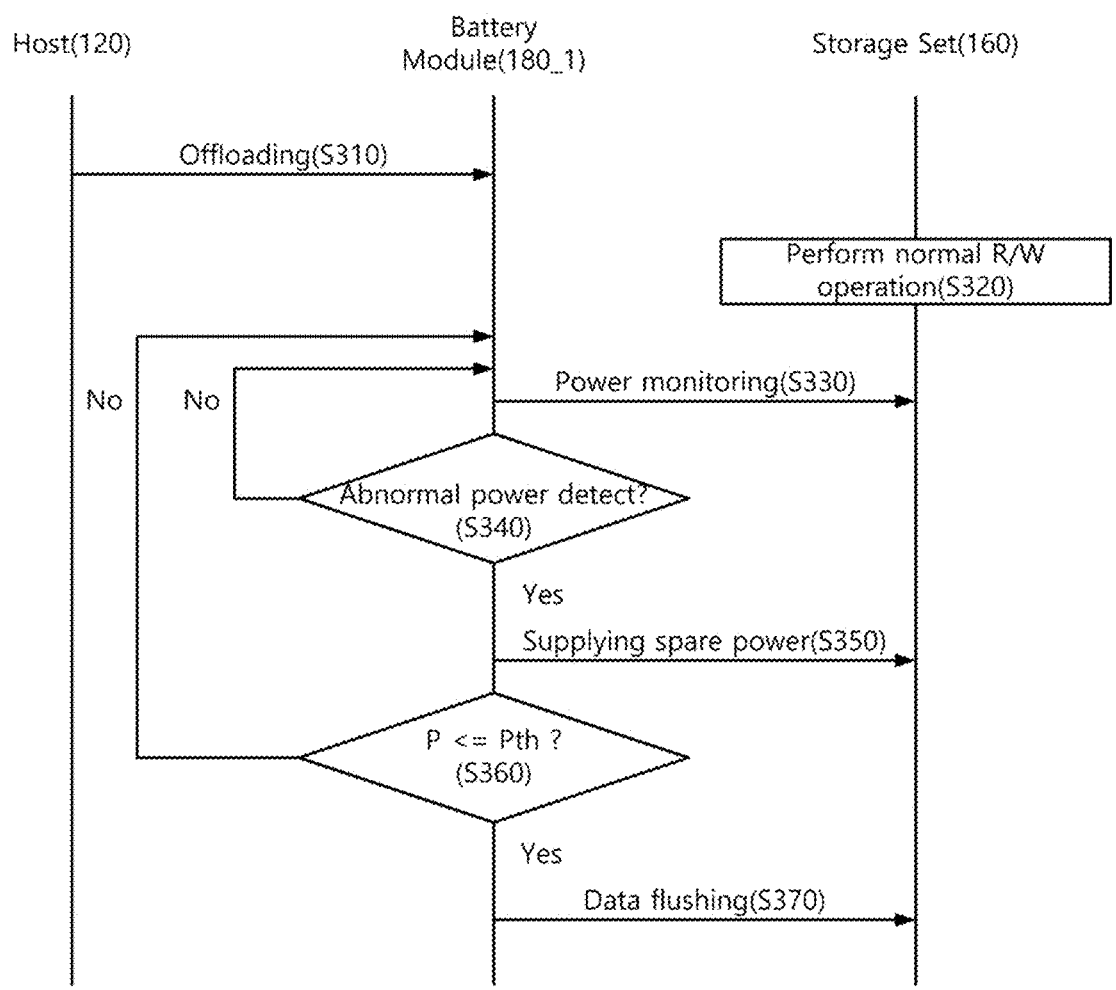
FIG. 11 illustrates a method of operating a storage system including a battery controller according to an embodiment of the present disclosure.

FIG. 11 illustrates a method of operating a storage system including a battery controller, according to an embodiment of the present disclosure.

Referring to FIG. 11, in step S310, the host 120 included in the storage system 100 first offloads at least one of a power management operation for the plurality of storage sets 160 or a power policy or a priority set for each of the plurality of storage sets 160. The offloading operation may be performed through the connection interface CI_BB. To this end, the battery controller 181 included in the battery module 180_1 may be reconfigured and reprogrammed.

In step S320, the storage set 160 performs normal write/read operations R/W, based on the power supplied from the supplied general power.

In step S330, the battery module 180_1 monitors power of the storage set 160. The operation of monitoring the power is an operation for detecting the above-described abnormal power drop. For example, the operation of monitoring power for the storage set 160 may be performed through the SM bus (SM_BUS).

In step S340, the battery module 180_1 determines whether abnormal power, i.e., power drop, is detected during the operation of monitoring the power. When the power drop is not detected (e.g., No), the battery module 180_1 may consecutively perform step S330.

When a power drop is detected in step S340, the battery module 180_1 supplies the spare power to the storage set 160 in step S350. The battery module 180_1 may supply the spare power to at least one storage set, in which a power drop is detected, of the plurality of storage sets 160 through the switching block 141 included in the back plane 140.

In step S360, the battery module 180_1 monitors whether the power of at least one storage set is less than or equal to the threshold value (Pth) while supplying the spare power. When the power is not less than or equal to the threshold value (Pth), it may be determined that the power is recovered by supplying the spare power, and thus step S320 and step S330 may be performed again.

When the power of at least one storage set is detected as being less than or equal to the threshold (Pth) in step S360, the battery module 180_1 controls at least one storage set to perform a data flushing operation in step S370. The at least one storage set dumps data, which is stored in the volatile memory, to the NVM to prevent data from being lost due to the power drop.

According to the above-described embodiments of the present disclosure, especially when a power glitch, which is a temporary power drop phenomenon, is detected, the battery module 180_1 immediately supplies the spare power. When the power is lowered to be less than or equal to the threshold value, the battery module 180_1 may control the storage set 160 to perform the data flushing, thereby preventing data from being lost even under a power glitch situation.

Data Copy

According to an embodiment, the battery controller 181 may copy data of the storage set 160 to cope with when an abnormal power drop is detected. To this end, the battery controller 181 may be programmed to copy data. Hereinafter, an embodiment related to a data copy function will be described with reference to FIGS. 11 and 12.

Figure 12:
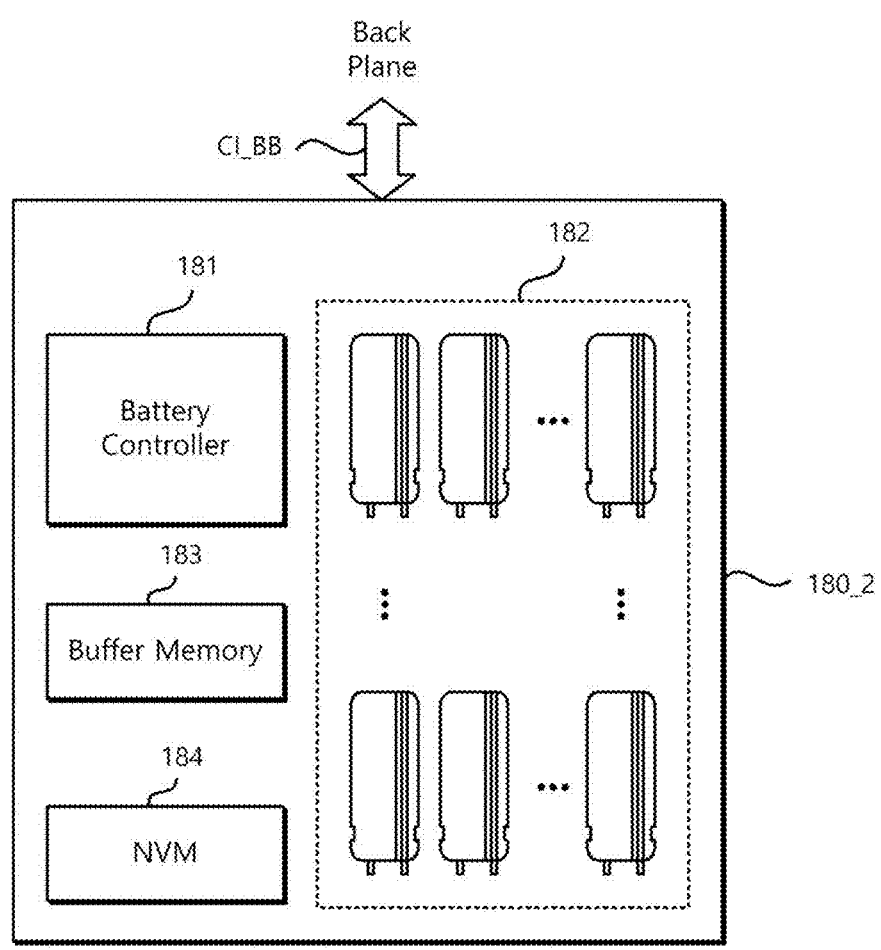
FIG. 12 illustrates a battery module according to another embodiment of the present disclosure.

FIG. 12 illustrates a battery module according to another embodiment of the present disclosure.

Referring to FIG. 12, a battery module 180_2 according to another embodiment may include a buffer memory 183 and an NVM 184 in addition to the above-described battery controller 181 and at least one battery 182. Herein, the battery module 180_2 of FIG. 12 may be replaced with the battery module 180 of FIGS. 1, 3, and 4. The buffer memory 183 and the NVM 184 may store the copied data, when the data of the storage set 160 is copied.

The battery controller 181 monitors the plurality of storage sets 160 and may detect abnormal power drops from the plurality of storage sets 160 through monitoring. For example, the battery controller 181 may monitor the storage set 160 through the SM bus (SM_BUS) included in the connection interface CI_BB. Alternatively, the battery controller 181 may determine power consumption (that is, usual power consumption) of the plurality of storage sets 160 when the power drop is not detected through the monitoring operation.

When a power drop is detected through monitoring, the battery controller 181 determines whether to select the storage set 160, in which the power drop is detected, as an alternative storage set, based on at least one of the usual power consumption or the set priority of the storage set 160 in which the power drop is detected. For example, when the storage set 160 shows lower usual power consumption (e.g., when the usual power consumption is less than or equal to the preset power consumption), the battery controller 181 may determine the risk of the failure of data copy as being lowered in the storage set 160 and may select the storage set 160 as an alternative storage set.

When selecting the storage set 160 in which the power drop is detected as the alternative storage set, the battery controller 181 copies data stored in the non-volatile memory included in the storage set 160 in which the power drop occurs, through the connection interface CI_BB. When data copy is completed, the battery controller 181 notifies the host 120 of information on the data copy completion. Thereafter, when receiving the information on the data copy completion, the host 120 reads the copied data stored in the battery module 180.

Figure 13:
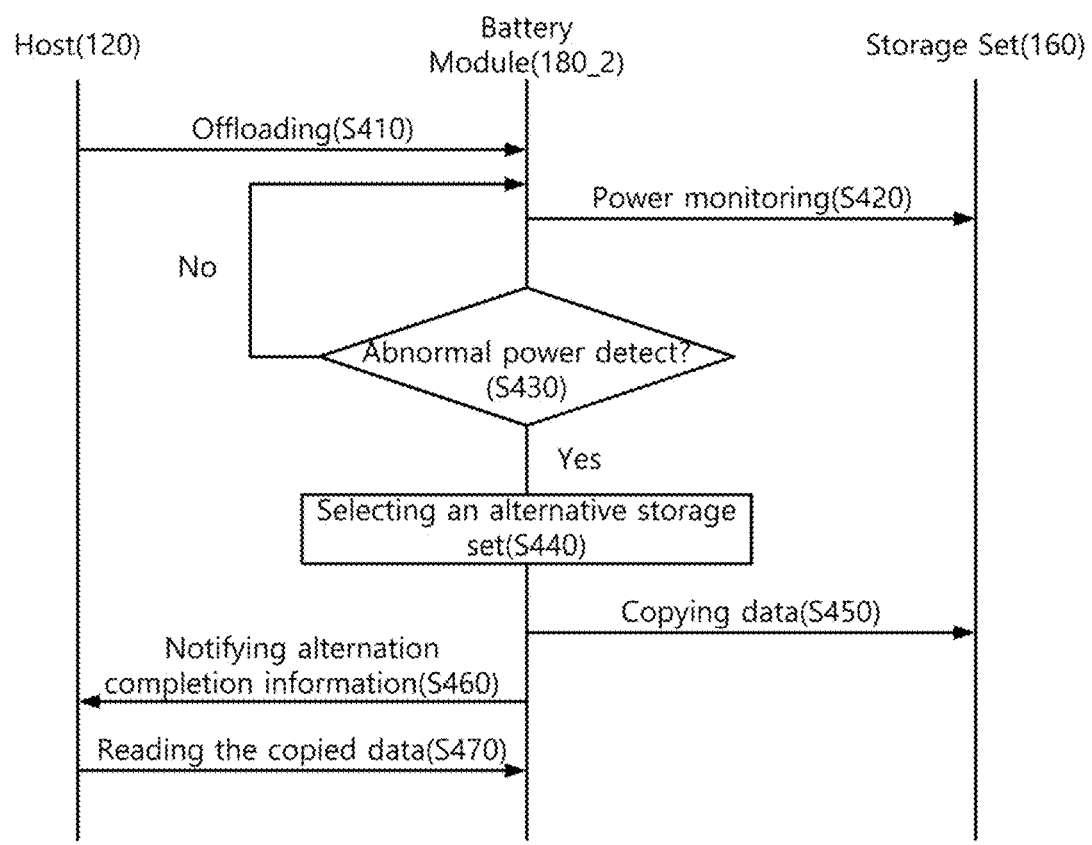
FIG. 13 is a flowchart illustrating a method of operating a storage system including a battery module of FIG. 12 according to example embodiments.

FIG. 13 is a flowchart illustrating a method of operating a storage system including the battery module of FIG. 12 according to example embodiments.

Referring to FIG. 13, in step S410, the host 120 included in the storage system 100 first offloads at least one of a power management operation for the plurality of storage sets 160 or a power policy or a priority set for each of the plurality of storage sets 160. The offloading operation may be performed through the connection interface. To this end, the battery controller 181 included in the battery module 180_2 may be reconfigured and reprogrammed. In particular, information on the priority required for selecting an alternative storage set may be offloaded.

In step S420, the battery module 180_2 monitors power of the storage set 160. The operation of monitoring the power is an operation for detecting the above-described abnormal power drop or determining the usual power consumption. For example, the operation of monitoring the power for the storage set 160 may be performed through the SM bus (SM_BUS).

In step S430, the battery module 180_2 determines whether abnormal power, i.e., power drop, is detected while monitoring the power. When the power drop is not detected, the battery module 180_2 may continuously perform step S420.

When a power drop is detected in step S430, the battery module 180_2 determines, in step S440, whether to select the storage set 160, in which the power drop is detected, as an alternative storage set, based on at least one of the usual power consumption or the set priority of the storage set 160 in which the power drop is detected.

When the storage set 160 in which the power drop is detected is selected as the alternative storage set, the battery module 180_2 copies data stored in the alternative storage set in step S450. The copied data may be stored in the memory (the buffer memory 183 and/or the NVM 184) included in the battery module 180_2.

In step S460, when data copy is completed, the battery module 180_2 notifies the host 120 of information on the data copy completion.

In step S470, the host 120 reads the coped data from the battery module 180_2.

According to the embodiments of the present disclosure, when a power drop is detected, an alternative storage set may be selected based on the priority and the usual power consumption, and data from the selected alternative storage set is copied to prevent the data loss.

As described above, the present disclosure may provide a storage system including a battery module, capable of preventing data loss when a power drop occurs in a storage device performing a computing function and a method for operating the same.

The above description refers to detailed embodiments for carrying out the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A storage system comprising:
   a host;
   a back plane including a switching block and connected to the host;
   a plurality of storage sets connected to the back plane and configured to receive power from the host; and
   a battery module connected to the back plane and configured to:
   supply spare power to at least one storage set of the plurality of storage sets through the switching block, in response to an abnormal power drop being detected in the at least one storage set of the plurality of storage sets, and
   control the at least one storage set to perform a data flushing operation, in response to the power from the host less than or equal to a threshold value being detected in the at least one storage set after supplying the spare power,
   wherein the abnormal power drop is detected when the power from the host drops to a first value greater than the threshold value,
   wherein the battery module is configured to:
   detect the first value of the power greater than the threshold value at a first time point and a second value of the power less than or equal to the threshold value at a second time point after the first time point, supply the spare power to the at least one storage set in response to the power being detected the first value at the first time point, and control the at least one storage set to perform the data flushing operation in response to the power being detected the second value at the second time point, and wherein the second value of the power is detected at the second time point when the power drops from the first value at the first time point to the second value at the second time point.

2. The storage system of claim 1, wherein each of the plurality of storage sets includes:

a storage device including a non-volatile memory;

an accelerator connected to the storage device and configured to perform a computation in response to a command from the host; and a volatile memory configured to store at least one of computation data, which results from the computation and system data offloaded from the host.

3. The storage system of claim 2, wherein the data flushing operation is defined as an operation of dumping the computation data, which is stored in the volatile memory, into the non-volatile memory.

4. The storage system of claim 1, wherein the battery module includes:

at least one battery; and a battery controller configured to detect the abnormal power drop and control the switching block such that the spare power is supplied to the at least one storage set from the at least one battery.

5. The storage system of claim 4, wherein the battery controller is further configured to:

detect a work load for each of the plurality of storage sets, and set the threshold value for each of the plurality of storage sets, based on the work load.

6. The storage system of claim 4, wherein the battery controller is further configured to:

detect a work load for each of the plurality of storage sets, and set the spare power for each of the plurality of storage sets, based on the work load.

7. The storage system of claim 1, further comprising:

a PCIe interface and a system management bus configured to connect the back plane to the plurality of storage sets.

8. The storage system of claim 7, wherein the battery module is configured to supply the spare power to the at least one storage set through the PCIe interface.

9. The storage system of claim 7, wherein the battery module is configured to detect the abnormal power drop from the plurality of storage sets through the system management bus.

10. The storage system of claim 1, wherein the battery module is further configured to continue monitoring the abnormal power drop in response to the power less than or equal to the threshold value not being detected in the at least one storage set after supplying the spare power.

11. A storage system comprising:

a host;

a back plane connected to the host and including a switching block;

a plurality of storage sets connected to the back plane and configured to receive power from the host; and a battery module connected to the back plane, including at least one battery, and configured to:

be offloaded a power management operation for the plurality of storage sets from the host, and to perform the power management operation through the switching block, detect whether an abnormal power drop occurs in at least one storage set of the plurality of storage sets, supply spare power to at least one storage set of the plurality of storage sets from the at least one battery in response to the abnormal power drop being detected, and control the at least one storage set to perform data flushing in response to the power from the host less than or equal to a threshold value being detected in the at least one storage set after supplying the spare power, wherein the abnormal power drop is detected when the power from the host drops to a first value greater than the threshold value, wherein the battery module is configured to:

detect the first value of the power greater than the threshold value at a first time point and a second value of the power less than or equal to the threshold value at a second time point after the first time point, supply the spare power to the at least one storage set in response to the power being detected the first value at the first time point, and control the at least one storage set to perform the data flushing in response to the power being detected the second value at the second time point, and wherein the second value of the power is detected at the second time point when the power drops from the first value at the first time point to the second value at the second time point.

12. The storage system of claim 11, wherein the battery module includes:

a battery controller configured to perform the power management operation, based on at least one of a power policy or a priority set for each of the plurality of storage sets.

13. The storage system of claim 11, wherein the battery module includes a battery controller configured to:

detect a work load for each of the plurality of storage sets, and set the threshold value for each of the plurality of storage sets, based on the work load.

14. The storage system of claim 11, wherein the battery module includes a battery controller configured to:

detect a work load for each of the plurality of storage sets, and set the spare power for each of the plurality of storage sets, based on the work load.

15. The storage system of claim 11, further comprising:

a PCIe interface and a system management bus configured to connect the back plane to the plurality of storage sets, wherein the battery module is configured to detect the abnormal power drop from the plurality of storage sets through the system management bus, and supply power through the PCIe interface.

16. An operating method of a storage system, the operating method comprising:

supplying power from a host to a plurality of storage sets included in the storage system;

monitoring whether an abnormal power drop is detected in at least one storage set of the plurality of storage sets;

supplying spare power to the at least one storage set when the abnormal power drop is detected; and controlling the at least one storage set to perform data flushing, when the power from the host less than or equal to a threshold value is detected in the at least one storage set after supplying the spare power, wherein the monitoring of whether the abnormal power drop is detected includes detecting the abnormal power drop when the power from the host drops to a first value greater than the threshold value, wherein the detecting of the abnormal power drop includes detecting the first value of the power greater than the threshold value at a first time point, wherein the controlling of the at least one storage set to perform the data flushing includes detecting a second value of the power less than or equal to the threshold value at a second time point after the first time point, and wherein the second value of the power is detected at the second time point when the power drops from the first value at the first time point to the second value at the second time point.

17. The operating method of claim 16, further comprising:

detecting a work load for each of the plurality of storage sets; and setting the threshold value for each of the plurality of storage sets, based on the work load.

18. The operating method of claim 17, further comprising:

setting the spare power for each of the plurality of storage sets, based on the work load.

* * * * *